(12) United States Patent
Tanaka et al.

(10) Patent No.: US 7,042,159 B2
(45) Date of Patent: May 9, 2006

(54) PLASMA REACTOR AND PURIFICATION EQUIPMENT

(75) Inventors: Toshio Tanaka, Osaka (JP); Kanji Motegi, Osaka (JP); Kenkichi Kagawa, Osaka (JP); Toshikazu Ohkubo, Oita (JP)

(73) Assignee: Daikin Industries, Ltd., Osaka (JP)

( * ) Notice: Subject to any disclaimer, the term of this patent is extended or adjusted under 35 U.S.C. 154(b) by 49 days.

(21) Appl. No.: 10/774,690

(22) Filed: Feb. 10, 2004

(65) Prior Publication Data

US 2005/0174062 A1 Aug. 11, 2005

(51) Int. Cl.
*H01J 7/24* (2006.01)
*H05B 31/26* (2006.01)

(52) U.S. Cl. .................. 315/111.21; 422/168
(58) Field of Classification Search ......... 315/111.21–111.71; 422/186.04, 186.18, 168–183; 423/210, 235, 245.1
See application file for complete search history.

(56) References Cited

U.S. PATENT DOCUMENTS

| | | | |
|---|---|---|---|
| 4,954,320 A * | 9/1990 | Birmingham et al. .. | 422/186.04 |
| 5,801,489 A * | 9/1998 | Chism et al. ........... | 315/111.21 |
| 6,455,014 B1 * | 9/2002 | Hammerstrom et al. ............ | 422/186.04 |
| 6,811,757 B1 * | 11/2004 | Niv et al. ............. | 422/186.04 |
| 6,818,193 B1 * | 11/2004 | Christodoulatos et al. .. | 423/210 |
| 2001/0043890 A1 * | 11/2001 | Son ........................ | 422/174 |
| 2004/0050684 A1 * | 3/2004 | Babko-Malyi et al. ...... | 204/164 |

FOREIGN PATENT DOCUMENTS

| | | | |
|---|---|---|---|
| JP | 8-155249 | | 6/1996 |
| JP | 08-155249 | * | 6/1996 |
| JP | 9-869 | | 1/1997 |
| JP | 09-000869 | * | 1/1997 |
| JP | 2003-38932 | | 2/2003 |

* cited by examiner

*Primary Examiner*—Wilson Lee
*Assistant Examiner*—Leith A. Al-Nazer
(74) *Attorney, Agent, or Firm*—Shinjyu Global IP Counselors

(57) ABSTRACT

In the plasma reactor of the present invention, streamer discharge is caused in a wide region so as to increase a plasma generation region without complicating the architecture of the plasma reactor and increasing the cost. In the plasma reactor of the invention, a needle-shaped first electrode and a plate-shaped second electrode are disposed to oppose and to be perpendicular to each other, and the first electrode has a pointed portion as the end thereof on the side of the second electrode and the pointed portion has a point angle θ not less than 30 degrees and not more than 90 degrees, and preferably not less than 60 degrees and not more than 90 degrees.

37 Claims, 9 Drawing Sheets

PLASMA REACTOR AND PURIFICATION EQUIPMENT

BACKGROUND OF THE INVENTION

The present invention relates to a plasma reactor for performing a gas treatment for air purification and the like by generating low temperature plasma through streamer discharge and purification equipment using the plasma reactor, and more particularly, it relates to a technique to generate low temperature plasma in a wide region through discharge.

A plasma reactor utilizing low temperature plasma has been conventionally used in air purification equipment or gas treatment equipment that decomposes a toxic component or an odor component included in, for example, air or exhaust gas by using the function of active species generated by plasma so as to make such a component innocent or odorless. For example, Japanese Laid-Open Patent Publication No. 8-155249 or 9-869 discloses an apparatus in which a plurality of needle-shaped electrodes working as discharge electrodes are disposed substantially perpendicular to a plate-shaped electrode working as a counter electrode and plasma is generated by causing streamer discharge between the discharge electrodes and the counter electrode, so as to perform a gas treatment with a target gas introduced into the discharge field.

When the streamer discharge is caused in the aforementioned manner, a narrow column-shaped space between each discharge electrode and the counter electrode corresponds to the discharge field. The discharge field is formed with respect to each of the discharge electrodes, and each discharge field has a comparatively small region. Therefore, in the apparatus disclosed in each of the aforementioned publications, the discharge electrodes are densely arranged in one or more lines, so as to increase a plasma generation region by suppressing gaps made between the plural discharge fields formed between the respective discharge electrodes and the counter electrode.

The aforementioned architecture, however, is complicated because a large number of discharge electrodes should be densely arranged.

Accordingly, if the discharge field corresponding to each discharge electrode can be increased, the plasma generation region can be increased even when the number of discharge electrodes is reduced. For example, when a steep pulse high voltage having a pulse rise time as short as approximately 100 ns or less and a pulse width of approximately 1 μs or less is applied between a discharge electrode and a counter electrode, plasma can be generated in a comparatively wide region.

This is for the following reasons: 1) Since the application time of the voltage is short, a high voltage that may cause a spark in general discharge can be instantaneously applied; 2) discharge can be easily caused all over the place when the application voltage is high; 3) the voltage rise is so steep that the discharge is less suppressed by the space charge effect; and 4) the rise time is so short that homogenous discharge can be easily caused.

When a pulse power source for supplying such a steep pulse high voltage with a small pulse width is used, however, the scale of the whole equipment is large and hence the cost is high. Furthermore, the discharge can be caused merely during a short time corresponding to a very small pulse width, and therefore, the time for generating the plasma is also short, resulting in lowering the efficiency of the gas treatment.

The present invention was devised in consideration of these disadvantages, and an object is increasing a plasma generation region formed through streamer discharge without making the architecture of a plasma reactor complicated and without increasing the cost.

SUMMARY OF THE INVENTION

According to the invention, in a plasma reactor for treating a target gas by generating low temperature plasma by causing streamer discharge between a needle-shaped electrode and a plate-shaped electrode, the shape of a pointed portion of the needle-shaped electrode is specified.

Specifically, a plasma reactor according to a first aspect of the invention includes a first electrode in the shape of a needle; a second electrode in the shape of a plate disposed to oppose and to be substantially perpendicular to the first electrode; and power supply means connected to the first and second electrodes for applying a discharge voltage, and the first electrode and the second electrode are disposed in a passage space of a target fluid for treating the target fluid by causing streamer discharge between the first and second electrodes. In this plasma reactor, the first electrode has a pointed portion as an end thereof on the side of the second electrode and the pointed portion has a point angle $\theta$ not less than 30 degrees and not more than 90 degrees. It is noted that "the pointed portion" herein means a portion in a tapered shape having a smaller diameter toward the tip thereof (including a circular cone shape and a pyramid shape) and the tip of the pointed portion need not be sharp.

In the first aspect, when the discharge voltage is applied to the first electrode and the second electrode by the power supply means, streamer discharge is caused. The streamer discharge is formed as a plasma column with light emission owing to small electric arcs caused continuously from the pointed portion of the first electrode to the second electrode, and the small electric arcs progress in a row in a region with a small distance between the equipotential surfaces between the first electrode and the second electrode. Since the point angle $\theta$ of the first electrode is specified in the aforementioned angle range, the small electric arc can easily progress while spreading in a wide range, and hence, the streamer discharge is caused in a wide region. In other words, the streamer discharge obtained in this case is caused in a region spreading in the shape of a flare from the first electrode toward the second electrode.

According to a second aspect, the point angle $\theta$ of the first electrode is not less than 60 degrees and not more than 90 degrees in the plasma reactor according to the first aspect.

When the point angle $\theta$ of the first electrode is not less than 60 degrees and not more than 90 degrees, the streamer discharge can be more easily caused.

According to a third aspect, the point angle $\theta$ of the first electrode is substantially 60 degrees in the plasma reactor according to the second aspect.

When the point angle $\theta$ of the first electrode is substantially 60 degrees, even if the fabrication accuracy of the needle-shaped effective length of the first electrode is poor, the streamer discharge can be stably caused as far as the fabrication accuracy of the curvature radius of the pointed portion of the first electrode can be secured.

According to a fourth aspect, the point angle $\theta$ of the first electrode is substantially 80 degrees in the plasma reactor according to the second aspect.

When the point angle $\theta$ of the first electrode is substantially 80 degrees, even if the fabrication accuracy of the curvature radius of the pointed portion of the first electrode is poor, the streamer discharge can be stably caused as far as the fabrication accuracy of the needle-shaped effective length of the first electrode can be secured.

According to a fifth aspect, the pointed portion of the first electrode is in a spherical shape in the plasma reactor according to any of the first through fourth aspects. In other words, the pointed portion of the first electrode is finely rounded in the present plasma reactor.

In the fifth aspect, since the pointed portion of the first electrode is in a spherical shape, the small electric arcs can more easily spread, resulting in causing the discharge plasma in a wider region.

According to sixth through thirteenth aspects, the diameter and the length of the first electrode, the curvature radius of the pointed portion of the first electrode and the like are specified in particular ranges. Thus, glow discharge can be avoided, occurrence of sparks can be suppressed, and the streamer discharge can be stably caused, and therefore, when such a plasma reactor is used in air purification equipment, high purification performance can be exhibited for a long period of time.

Specifically, according to the sixth aspect, the first electrode has a needle-shaped effective length L not less than 4 mm and not more than 30 mm in the plasma reactor according to any of the first through fifth aspects.

According to the seventh aspect, the pointed portion of the first electrode has a curvature radius R not less than 0.1 mm and not more than 0.7 mm in the plasma reactor according to any of the first through sixth aspects.

According to the eighth aspect, a ratio L/G between a needle-shaped effective length L of the first electrode and an electrode gap G is not less than 0.2 and not more than 1.5 in the plasma reactor according to any of the first through seventh aspects. It is noted that "the electrode gap" herein means a distance between the pointed portion of the first electrode and a treatment member when the treatment member is disposed between the first electrode and the second electrode as in a fifteenth aspect below and means a distance between the pointed portion of the first electrode and the second electrode when the treatment member is not used. This similarly applies to all the description below.

According to the ninth aspect, a ratio L/D between a needle-shaped effective length L and a diameter D of the first electrode is not less than 2 and not more than 15 in the plasma reactor according to any of the first through eighth aspects.

According to the tenth aspect, a ratio R/G between a curvature radius R of the pointed portion of the first electrode and an electrode gap G is not less than 0.005 and not more than 0.035 in the plasma reactor according to any of the first through ninth aspects.

According to the eleventh aspect, a ratio R/D between a curvature radius R of the pointed portion of the first electrode and a diameter D of the first electrode is not less than 0.05 and not more than 0.35 in the plasma reactor according to any of the first through tenth aspects.

According to the twelfth aspect, a needle-shaped effective length L of the first electrode, an electrode gap G and the point angle $\theta$ of the first electrode satisfy the following formula: $0.25 \leq L/(G\theta) \leq 1.2$ in the plasma reactor according to any of the first through eleventh aspects.

According to the thirteenth aspect, a needle-shaped effective length L and the point angle $\theta$ of the first electrode satisfy the following formula: $5 \leq L/\theta \leq 24$ in the plasma reactor according to any of the first through twelfth aspects.

According to a fourteenth aspect, the second electrode has an opening through which the target fluid passes in the plasma reactor according to any of the first through thirteenth aspects.

In the fourteenth aspect, when the target fluid flows through the discharge field formed between the first electrode and the second electrode, it passes through the opening of the second electrode. Also, since the plasma generation region spreads in the shape of a flare toward the second electrode, the target fluid passes through the opening of the second electrode where the plasma has the largest width.

According to a fifteenth aspect, the plasma reactor according to any of the first through fourteenth aspects further includes a treatment member for treating the target fluid, and the treatment member is disposed between or downstream of the first electrode and the second electrode. In this case, the treatment member may be disposed in a position slightly away from the discharge field formed between the first electrode and the second electrode as far as the position is within the range of the plasma, and thus, the effect of the treatment member can be attained.

In the fifteenth aspect, since the treatment member is disposed in or downstream of the discharge field, the target fluid passes the treatment member when it passes the discharge field. Accordingly, the target fluid can be definitely treated.

According to a sixteenth aspect, the treatment member is disposed between the first electrode and the second electrode and in the vicinity of the second electrode in the plasma reactor according to the fifteenth aspect.

In the sixteenth aspect, the treatment member is disposed in a portion of the plasma generation region with the largest width. Therefore, when the target fluid passes this wide region, it passes through the treatment member while being affected by the plasma.

According to a seventeenth aspect, the treatment member has a catalytic substance for accelerating the treatment of the target fluid in the plasma reactor according to the fifteenth or sixteenth aspect.

In the seventeenth aspect, since the treatment member includes the catalytic substance, the target fluid is affected not only by the plasma but also by the catalytic substance in the discharge field.

According to an eighteenth aspect, the catalytic substance includes at least one element selected from the group consisting of Pt (platinum), Pd (palladium), Ni (nickel), Ir (iridium), Rh (rhodium), Co (cobalt), Os (osmium), Ru (ruthenium), Fe (iron), Re (rhenium), Tc (technetium), Mn (manganese), Au (gold), Ag (silver), Cu (copper), W (tungsten), Mo (molybdenum) and Cr (chromium) in the plasma reactor according to the seventeenth aspect. Some of these elements such as Fe and Mn may be included in the form of an oxide (for example, as $Fe_2O_3$ or $MnO_2$).

The catalytic substances specified in the eighteenth aspect further excite a variety of active species (such as ozone, a hydroxy radical, an excited oxygen molecule, an excited nitrogen molecule and an excited water molecule) produced through the streamer discharge while decomposing a target component included in the target fluid. Therefore, the active species with higher activity affect the target component. Also, a large number of active species in an activated state are adsorbed onto the catalytic substance. Accordingly, these functions accelerate a chemical reaction occurring in treating the target fluid. Therefore, when the target fluid is, for example, air including a toxic component or an odor component, a chemical reaction for making such a component innocent or odorless is accelerated.

According to a nineteenth aspect, the catalytic substance includes not less than 10 mass % and not more than 60 mass % of a manganese-based catalyst in the plasma reactor according to the seventeenth aspect. According to a twentieth aspect, the catalytic substance includes not less than 30 mass % and not more than 40 mass % of the manganese-based catalyst in the plasma reactor according to the nineteenth aspect.

In each of the nineteenth aspect and the twentieth aspect, in the case where a manganese-based catalyst is used, the content of the manganese-based catalyst, such as Mn, $MnO_2$ or $Mn_2O_3$, is specified, and therefore, the performance of the plasma reactor can be optimized. Conversely speaking, when the content of the Mn, $MnO_2$ or $Mn_2O_3$ in the catalytic substance is too small, the performance for decomposing the toxic component or the like is insufficient, and when the content is too large, the specific surface area of the catalytic substance is too small to attain sufficient performance. When the content is specified as described above, however, the optimum performance can be attained.

According to a twenty-first aspect, the treatment member includes, as the catalytic substance, a mixture of a manganese oxide and an oxide of at least one of iron, cerium, europium, lanthanum and copper (hereinafter referred to as the specified oxide), or a composite oxide of manganese and at least one of one of iron, cerium, europium, lanthanum and copper in the plasma reactor according to the seventeenth aspect.

In the twenty-first aspect, when the target fluid passes the discharge field formed between the first and second electrodes, the target fluid is changed into plasma, resulting in generating low temperature plasma. This low temperature plasma produces various active species such as ozone, radicals like a hydroxy radical, an excited oxygen molecule, an excited nitrogen molecule and an excited water molecule. These various active species attain high activity owing to the function of the catalytic substance and efficiently react with the toxic component or the odor component so as to decompose such a component.

More specifically, the manganese oxide included in the catalytic substance decomposes ozone generated by the discharge into oxygen and active oxygen. This active oxygen oxidizes the toxic component or the odor component included in the target air so as to decompose it into an innocent component or an odorless component. Furthermore, the various active species, such as the active oxygen resulting from the decomposition of the ozone, radicals like a hydroxy radical, an excited oxygen molecule (active oxygen), an excited nitrogen molecule and an excited water molecule, are adsorbed in the form of the active species onto the surface of the specified oxide included in the treatment member or onto the interface between the manganese oxide and the specified oxide. Therefore, there exist a large number of active species with high activity as active groups on the surface of the catalyst, so that the toxic component or the odor component included in the target air can be rapidly decomposed.

According to a twenty-second aspect, the manganese oxide has a composition ratio not less than 20% and not more than 50% in the catalytic substance in the plasma reactor according to the twenty-first aspect. In this case, the specified oxide has the remainder content in the catalytic substance, its composition ratio is not less than 80% and not more than 50%.

In the twenty-second aspect, since the manganese oxide has the composition ratio not less than 20% and not more than 50% in the catalytic substance, the manganese oxide and the specified oxide are dispersed to be refined, so that the specific surface area of the catalytic substance can be increased. As a result, the interface between the manganese oxide and the specified oxide can be increased, and hence, the catalytic substance can adsorb a larger quantity of the active species and the activity can be further improved.

According to a twenty-third aspect, the treatment member includes, as the catalytic substance, a plurality of kinds of manganese oxides respectively having different oxidation numbers, such as $MnO_2$ and $Mn_2O_3$, in the plasma reactor according to the twenty-first or twenty-second aspect.

In the twenty-third aspect, since the catalytic substance includes the manganese oxides respectively having different oxidation numbers, as compared with the case where merely one kind of manganese oxide is used, a further larger quantity of active species can be adsorbed to be used in the chemical reaction in the treatment of the target fluid.

According to a twenty-fourth aspect, the treatment member includes an adsorbent for adsorbing a target component included in the target fluid in the plasma reactor according to any of the fifteenth through the twenty-third aspects.

According to a twenty-fifth aspect, the adsorbent is at least one of porous ceramic, activated carbon, activated carbon fiber, zeolite (aluminosilicate), mordenite, ferrierite and silicalite (silica gel) in the plasma reactor according to the twenty-fourth aspect.

In each of the twenty-fourth aspect and the twenty-fifth aspect, the target component included in the target fluid is adsorbed by the adsorbent. The target component thus adsorbed by the adsorbent is also decomposed by the plasma. In particular, when the adsorbent is included in the treatment member including the catalytic substance, the adsorbed component is decomposed by the catalytic substance, and therefore, the decomposition performance can be improved.

According to a twenty-sixth aspect, the first electrode is disposed on an upstream side of a flow of the target fluid, and the second electrode is disposed on a downstream side of the flow of the target fluid in the plasma reactor according to the first aspect.

In the twenty-sixth aspect, the discharge is caused along the flow of the target fluid, and therefore, the discharge can be stabilized.

According to a twenty-seventh aspect, the first electrode and the second electrode are alternately disposed along a flow of the target fluid in the plasma reactor according to the first aspect.

In the twenty-seventh aspect, since the first electrode and the second electrode are alternately disposed, the number of times of the target fluid passing the discharge is increased.

According to a twenty-eighth aspect, one first electrode is disposed on one side of the second electrode and another first electrode is disposed on the other side of the second electrode in the plasma reactor according to the first aspect.

In the twenty-eighth aspect, the second electrode works as a counter electrode for two first electrodes, and thus, the architecture can be simplified.

According to a twenty-ninth aspect, the power supply means is a pulse source for supplying a pulse with gentle rise and fall in the plasma reactor according to the first aspect.

According to a thirtieth aspect, the power supply means is an AC power supply in the plasma reactor according to the first aspect.

According to a thirty-first aspect, the power supply means is a DC power supply in the plasma reactor according to the first aspect.

In each of the twenty-ninth aspect through the thirty-first aspect, since there is no need to use a steep pulse, the whole equipment can be simplified.

According to a thirty-second aspect, the first electrode and the second electrode are plural in number and are disposed along a flow of the target fluid in the plasma reactor according to the first aspect.

In the thirty-second aspect, since the first electrode and the second electrode are plural in number, the number of times of the target fluid passing the discharge is increased.

According to a thirty-third aspect, the first electrode has needle electrodes, and the needle electrodes are dispersedly arranged on a cross-sectional plane of the passage space in the plasma reactor according to the first aspect.

In the thirty-third aspect, since the needle electrodes are dispersedly arranged, the target fluid can definitely pass the discharge.

The purification equipment according to a thirty-fourth aspect includes a casing; and a plasma reactor contained in a passage space of target air in the casing and including a first electrode in the shape of a needle, a second electrode in the shape of a plate disposed to oppose and to be substantially perpendicular to the first electrode, and power supply means connected to the first and second electrodes for applying a discharge voltage, and the first electrode has a pointed portion as an end thereof on the side of the second electrode and the pointed portion has a point angle $\theta$ not less than 30 degrees and not more than 90 degrees.

In this purification equipment, an odor component or a toxic component included in the target air is treated by allowing the target air to pass a discharge field of streamer discharge caused between the first and second electrodes.

In the thirty-fourth aspect, the odor component or the toxic component included in the target air is treated by using the low temperature plasma generated in a wide region by the streamer discharge, so as to purify the target air. Furthermore, when a treatment member including a catalytic substance and an adsorbent is used, the treatment is carried out also by using the function of the catalytic substance and the function of the adsorbent.

The purification equipment according to a thirty-fifth aspect includes a casing; and a plasma reactor contained in a passage space of a target gas in the casing and including a first electrode in the shape of a needle, a second electrode in the shape of a plate disposed to oppose and to be substantially perpendicular to the first electrode, and power supply means connected to the first and second electrodes for applying a discharge voltage, and the first electrode has a pointed portion as an end thereof on the side of the second electrode and the pointed portion has a point angle $\theta$ not less than 30 degrees and not more than 90 degrees.

In this purification equipment, a nitrogen oxide included in the target gas is treated by allowing the target gas to pass a discharge field of streamer discharge caused between the first and second electrodes.

The purification equipment according to a thirty-sixth aspect includes a casing; and a plasma reactor contained in a passage space of a flue gas in the casing and including a first electrode in the shape of a needle, a second electrode in the shape of a plate disposed to oppose and to be substantially perpendicular to the first electrode, and power supply means connected to the first and second electrodes for applying a discharge voltage, and the first electrode has a pointed portion as an end thereof on the side of the second electrode and the pointed portion has a point angle $\theta$ not less than 30 degrees and not more than 90 degrees.

In this purification equipment, a nitrogen oxide, unburnt fuel and hydrocarbon included in the flue gas are treated by allowing the flue gas to pass a discharge field of streamer discharge caused between the first and second electrodes.

The purification equipment according to a thirty-seventh aspect includes a casing; and a plasma reactor contained in a passage space of a flue gas in the casing and including a first electrode in the shape of a needle, a second electrode in the shape of a plate disposed to oppose and to be substantially perpendicular to the first electrode, and power supply means connected to the first and second electrodes for applying a discharge voltage, and the first electrode has a pointed portion as an end thereof on the side of the second electrode and the pointed portion has a point angle $\theta$ not less than 30 degrees and not more than 90 degrees.

In this purification equipment, dioxin included in the flue gas is treated by allowing the flue gas to pass a discharge field of streamer discharge caused between the first and second electrodes.

The purification equipment according to a thirty-eighth aspect includes a casing; and a plasma reactor contained in a passage space of a flon gas in the casing and including a first electrode in the shape of a needle, a second electrode in the shape of a plate disposed to oppose and to be substantially perpendicular to the first electrode, and power supply means connected to the first and second electrodes for applying a discharge voltage, and the first electrode has a pointed portion as an end thereof on the side of the second electrode and the pointed portion has a point angle $\theta$ not less than 30 degrees and not more than 90 degrees.

In this purification equipment, the flon gas is treated by allowing the flon gas to pass a discharge field of streamer discharge caused between the first and second electrodes.

In each of the purification equipment according to the thirty-fifth through thirty-eighth aspects, a nitrogen oxide or the like is treated by using the low temperature plasma.

According to the first aspect, since the point angle $\theta$ of the first electrode is specified in the aforementioned range (i.e., not less than 30 degrees and not more than 90 degrees), the small electric arcs can easily progress while spreading in a wide range in the discharge field, and therefore, the streamer discharge is caused in a wide region. Since the generation region of the streamer discharge is thus widened by specifying the shape of the first electrode, there is no need to use a pulse source for supplying a steep pulse high voltage with a small pulse width. Therefore, the cost can be suppressed and the whole equipment can be prevented from increasing its scale. Furthermore, since there is no need to use a steep pulse, an AC or DC high voltage power supply can be used, and therefore, the performance for treating a gas or the like can be improved by elongating the discharge time as compared with the case where a steep pulse voltage is used.

According to the second aspect, the point angle $\theta$ of the first electrode is specified to be not less than 60 degrees and not more than 90 degrees, so as to further easily cause the streamer discharge. Thus, the effects attained by the first aspect can be further improved.

According to the third aspect, since the point angle $\theta$ of the first electrode is substantially 60 degrees, even if the fabrication accuracy of the needle-shaped effective length of the first electrode is poor, the streamer discharge can be stably caused as far as the fabrication accuracy of the curvature radius of the pointed portion of the first electrode can be secured.

According to the fourth aspect, since the point angle $\theta$ of the first electrode is substantially 80 degrees, even if the fabrication accuracy of the curvature radius of the pointed portion of the first electrode is poor, the streamer discharge can be stably caused as far as the fabrication accuracy of the needle-shaped effective length of the first electrode can be secured.

According to the fifth aspect, since the pointed portion of the first electrode is in a spherical shape, the small electric arcs can more easily spread, resulting in causing the discharge plasma in a wider region.

According to the sixth aspect, since the first electrode has a needle-shaped effective length not less than 4 mm and not more than 30 mm, the streamer discharge can be stabilized by avoiding an electric field from being much collected on the pointed portion and avoiding failure of the discharge.

According to the seventh aspect, since the pointed portion of the first electrode has a curvature radius not less than 0.1 mm and not more than 0.7 mm, the streamer discharge can be stabilized as described above.

According to the eighth aspect, since the ratio between a needle-shaped effective length of the first electrode and an electrode gap is not less than 0.2 and not more than 1.5, the streamer discharge can be stabilized as described above.

According to the ninth aspect, since the ratio between a needle-shaped effective length and a diameter of the first electrode is not less than 2 and not more than 15, the streamer discharge can be stabilized as described above.

According to the tenth aspect, since the ratio between a curvature radius of the pointed portion of the first electrode and an electrode gap is not less than 0.005 and not more than 0.035, the streamer discharge can be stabilized as described above.

According to the eleventh aspect, since the ratio between a curvature radius of the pointed portion of the first electrode and a diameter of the first electrode is not less than 0.05 and not more than 0.35, the streamer discharge can be stabilized as described above.

According to the twelfth aspect, since a needle-shaped effective length L of the first electrode, an electrode gap G and the point angle $\theta$ of the first electrode satisfy the following formula: $0.25 \leq L/(G\theta) \leq 1.2$, the streamer discharge can be stably obtained.

According to the thirteenth aspect, since a needle-shaped effective length L and the point angle $\theta$ of the first electrode satisfy the following formula: $5 \leq L/\theta \leq 24$, the streamer discharge can be stably obtained.

According to the fourteenth aspect, when the target fluid flows through the discharge field formed between the first electrode and the second electrode, it passes through the opening of the second electrode where the plasma has the largest width. Therefore, the target fluid can be definitely treated.

According to the fifteenth aspect, since the target fluid definitely passes the treatment member disposed in or downstream of the discharge field, the target fluid can be definitely treated. As a result, the treatment performance can be improved.

According to the sixteenth aspect, the treatment member is disposed in a portion of the plasma generation region with the largest width. Therefore, when the target fluid passes this wide region, it passes through the treatment member while being affected by the plasma. As a result, the treatment performance of the plasma reactor can be improved.

According to the seventeenth aspect, since the treatment member includes the catalytic substance for accelerating the treatment of the target fluid, the target fluid is affected not only by the decomposition function of the plasma but also by the decomposition function of the catalytic substance. As a result, the treatment performance of the plasma reactor can be improved.

According to the eighteenth aspect, in treating the target component included in the target fluid, a variety of active species (such as ozone, a hydroxy radical, an excited oxygen molecule, an excited nitrogen molecule and an excited water molecule) produced by the low temperature plasma generated by the streamer discharge are further excited by the catalytic substance for attaining higher activity or are adsorbed in the activated state onto the catalytic substance, so that the chemical reaction can be accelerated. Therefore, the treatment performance can be further improved.

According to each of the nineteenth aspect and the twentieth aspect, since the content of Mn, $MnO_2$ or $Mn_2O_3$ is specified within the optimum range, the treatment performance of the plasma reactor can be improved.

According to the twenty-first aspect, the various active species produced by the low temperature plasma are effectively used in the treatment of the target fluid such as air purification, and the chemical reaction occurring in the treatment can be remarkably accelerated. Accordingly, the treatment performance of the plasma reactor can be improved. Also, since the treatment performance can be thus improved, the plasma reactor can be downsized.

According to the twenty-second aspect, since the manganese oxide has the composition ratio not less than 20% and not more than 50% in the catalytic substance, the specific surface area of the catalytic substance can be increased, and hence, the catalytic substance can adsorb a larger quantity of the active species. Therefore, the chemical reaction occurring in treating the target fluid can be further accelerated. As a result, the treatment performance of the plasma reactor can be further improved.

According to the twenty-third aspect, since the catalytic substance includes the manganese oxides respectively having different oxidation numbers, a further larger quantity of active species can be used in the chemical reaction in the treatment of the target fluid, and hence, the reaction can be further accelerated. As a result, the treatment performance of the plasma reactor can be further improved.

According to each of the twenty-fourth aspect and the twenty-fifth aspect, the target component included in the target fluid is adsorbed by the adsorbent to be also decomposed by the plasma. Therefore, the decomposition performance can be improved. In particular, when the adsorbent is included in the treatment member including the catalytic substance, the adsorbed component is decomposed by the catalytic substance, and therefore, the decomposition performance can be further improved.

According to the twenty-sixth aspect, the discharge is caused along the flow of the target fluid, and therefore, the discharge can be stabilized.

According to the twenty-seventh aspect, since the first electrode and the second electrode are alternately disposed, the number of times of the target fluid passing the discharge is increased, and hence, the treatment efficiency can be improved.

According to the twenty-eighth aspect, the second electrode works as a counter electrode for two first electrodes, and thus, the architecture can be simplified.

According to each of the twenty-ninth aspect through the thirty-first aspect, since there is no need to use a steep pulse, the whole equipment can be simplified.

According to the thirty-second aspect, since the first electrode and the second electrode are plural in number, the number of times of the target fluid passing the discharge is increased, and hence, the treatment efficiency can be improved.

According to the thirty-third aspect, since the needle electrodes are dispersedly arranged, the target fluid can definitely pass the discharge, and hence, the treatment efficiency can be improved.

According to the thirty-fourth aspect, since the odor component or the toxic component included in the target air can be definitely treated by using the low temperature plasma generated in a wide region through the streamer discharge, the target air can be efficiently purified. Also, when a treatment member including a catalytic substance and an adsorbent is used, the decomposition function of the catalytic substance and the adsorption function of the adsorbent are also exhibited, and therefore, the treatment performance can be further improved.

According to each of the thirty-fifth through thirty-eighth aspects, a nitrogen oxide or the like can be definitely treated by using the low temperature plasma generated in a wide region through the streamer discharge, the target gas or the like can be efficiently purified.

DETAILED DESCRIPTION OF THE INVENTION

Embodiment 1

Embodiment 1 of the invention will now be described in detail with reference to the accompanying drawings.

Figure 1:
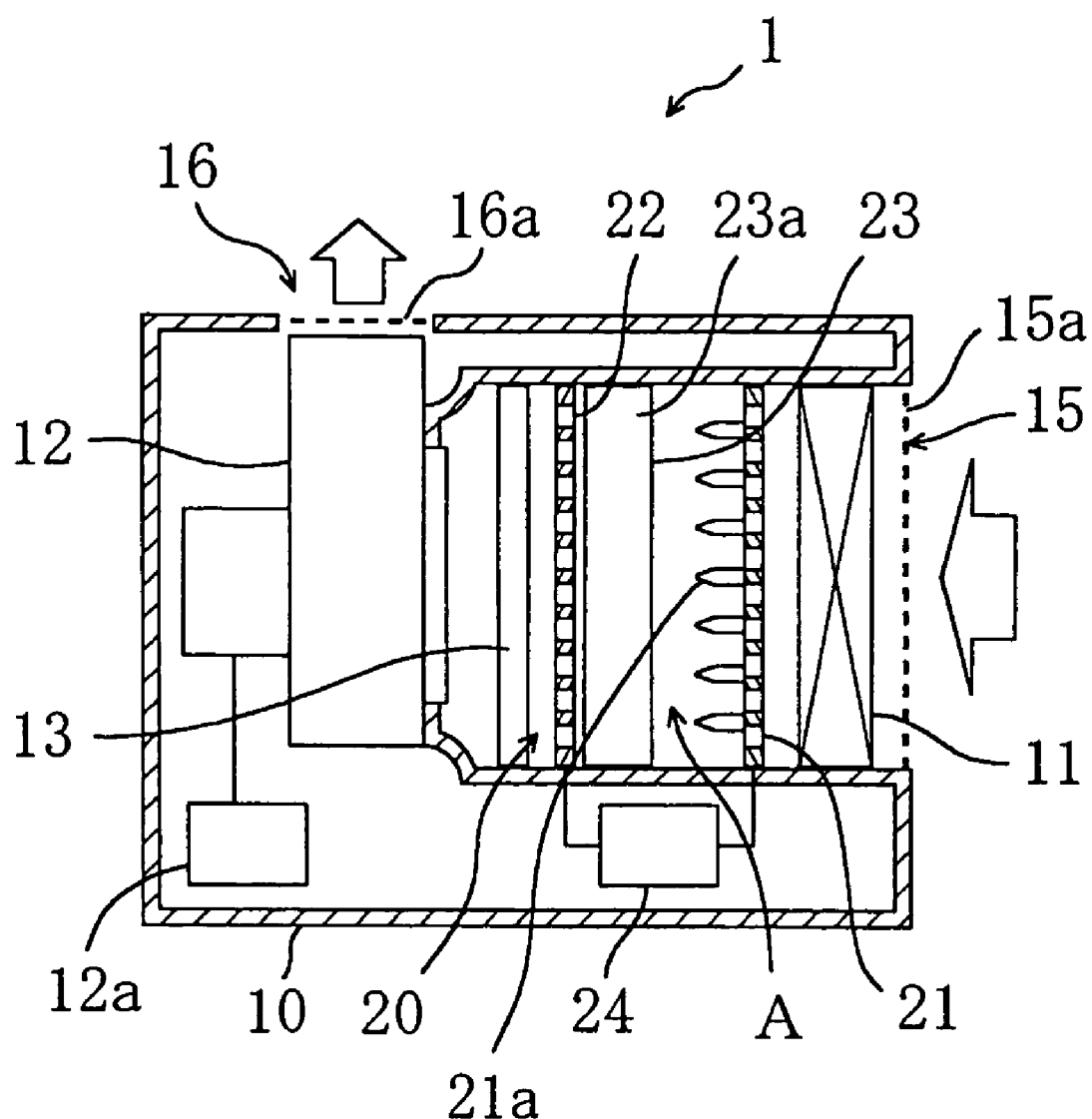
FIG. 1 is a diagram for showing the architecture of air purification equipment including a plasma reactor according to Embodiment 1 of the invention.

In this embodiment, air purification equipment 1 for purifying target air by treating an odor component or a toxic component included in the target air through oxidative destruction or the like will be described. FIG. 1 shows the rough architecture of the air purification equipment 1.

As shown in FIG. 1, the air purification equipment 1 has a casing 10 containing respective functional components, which are a dust filter 11, a centrifugal fan 12 and a plasma reactor 20. A reference numeral 13 shown in FIG. 1 denotes an ozonolysis catalyst for decomposing ozone generated through discharge.

An air inlet 15 for sucking the target air into the casing 10 is formed on one side face (on the right hand side in FIG. 1) of the casing 10, and an air outlet 16 is formed on the upper face thereof. The air inlet 15 is provided with an inlet grill 15a and the air outlet 16 is provided with an outlet grill 16a. The dust filter 11 is disposed inside the inlet grill 15a of the air inlet 15, so as to collect dust included in the sucked target air.

The air outlet 16 is formed in an edge portion on the opposite side to the air inlet 15 (namely, in a left side edge portion in FIG. 1) on the upper face of the casing 10. The centrifugal fan 12 is disposed within the casing 10 so as to correspond to the air outlet 16. The centrifugal fan 12 is connected to a fan power supply 12a. In this architecture, a space between the air inlet 15 and the air outlet 16 in the inside of the casing 10 corresponds to a passage space for the target air. When the centrifugal fan 12 is activated, the target air is sucked into the casing 10 through the inlet grill 15a of the air inlet 15 and the dust filter 11. The target air is blown out of the casing 10 through the outlet grill 16a of the air outlet 16 after being treated in the plasma reactor 20, which will be described in detail later.

Figure 2:
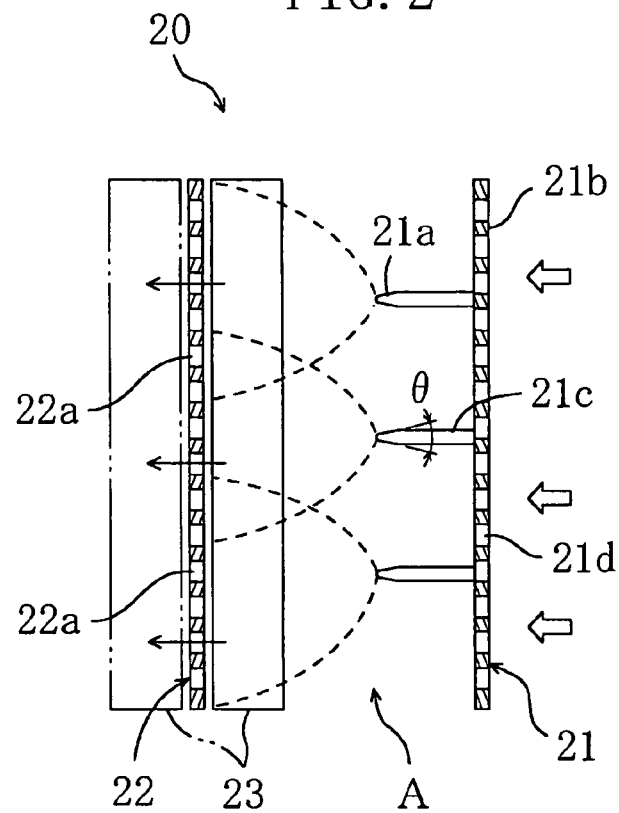
FIG. 2 is a schematic cross-sectional view of the plasma reactor used in the air purification equipment of FIG. 1.
Figure 3:
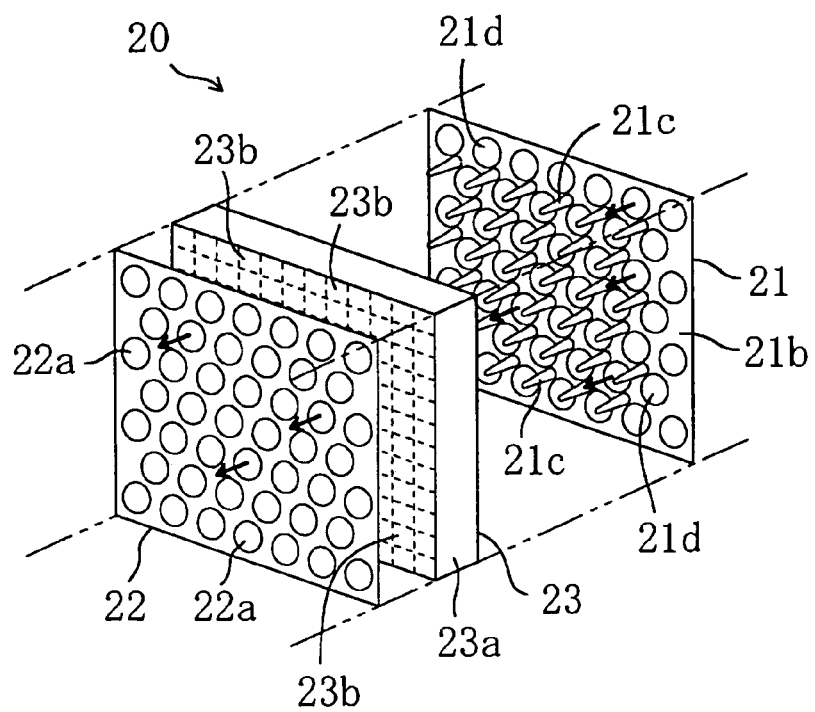
FIG. 3 is a schematic perspective view of the plasma reactor used in the air purification equipment of FIG. 1.

FIG. 2 is a cross-sectional view for roughly showing the architecture of the plasma reactor 20, and FIG. 3 is a perspective view thereof. This plasma reactor 20 includes a first electrode (discharge electrode) 21 and a second electrode (counter electrode) 22 together working as discharge means for generating low temperature plasma, and a treatment member 23 disposed between these electrodes 21 and 22 in the vicinity of the second electrode 22. In other words, the treatment member 23 is disposed in a discharge field A.

The treatment member 23 includes a honeycomb-shaped substrate 23a having a large number of holes 23b penetrating the substrate along a passing direction of the air, and holds a catalytic substance on its surface. Specifically, the treatment member 23 includes, as the catalytic substance, at least one of Pt, Pd, Ni, Ir, Rh, Co, Os, Ru, Fe, Re, Tc, Mn, Au, Ag, Cu, W, Mo and Cr. These catalytic substances accelerate a chemical reaction occurring in treating the target air.

The treatment member 23 holds not only the catalytic substance but also an adsorbent on the surface of the substrate 23a. The adsorbent adsorbs a target component, such as an odor component or a toxic component, included in the target air, and is, for example, activated carbon or zeolite. The adsorbent may be any of porous ceramic, activated carbon fiber, mordenite, ferrierite and silicalite, at least one of which is used.

The first electrode 21 is composed of an electrode plate 21b and a plurality of needle electrodes 21c fixed so as to be substantially perpendicular to the electrode plate 21b. The electrode plate 21b is made of a mesh material or a punching metal, and has a large number of openings 21d for allowing the air to pass therethrough in a direction perpendicular to its face. Also, the second electrode 22 uses an electrode plate, such as a mesh material or a punching metal, having a large number of opening 22a for allowing the air to pass therethrough in a direction perpendicular to its face.

Figure 4:
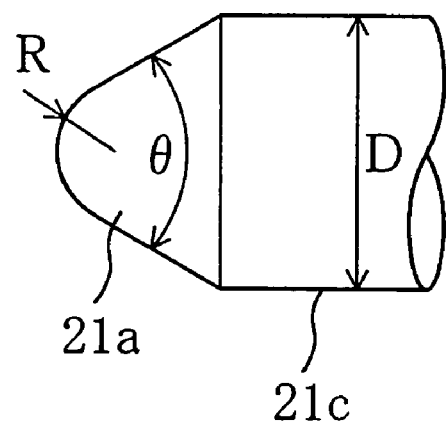
FIG. 4 is an enlarged partial view of a needle electrode.

The first electrode 21 is disposed so that its electrode plate 21b can be substantially parallel to the second electrode 22 with the needle electrodes 21c extending substantially perpendicular to the second electrode 22. As shown in an enlarged view of FIG. 4, each needle electrode 21c is formed so as to have an end opposing the second electrode as a pointed portion 21a having a point angle θ of 60 degrees.

Also, the pointed portion of the first electrode 21 is rounded through radius processing so as to be in a spherical shape. The point angle θ is preferably not less than 30 degrees and not more than 90 degrees, and more preferably not less than 60 degrees and not more than 90 degrees for causing streamer discharge more easily. In particular, when the point angle θ is 60 degrees, even if the fabrication accuracy of the needle-shaped effective length L (the effective length of the needle electrode) of the first electrode 21 is poor, the streamer discharge can be stably caused as far as the fabrication accuracy of the curvature radius R of the pointed portion of the first electrode 21 can be secured. Alternatively, when the point angle θ is 80 degrees, even if the fabrication accuracy of the curvature radius R of the pointed portion of the first electrode 21 is poor, the streamer discharge can be stably caused as far as the fabrication accuracy of the needle-shaped effective length L (the effective length of the needle electrode) of the first electrode 21 can be secured.

Both the electrodes 21 and 22 are connected to a DC, AC or pulse high voltage power supply (power supply means) 24, so that the streamer discharge can be caused between the first electrode 21 and the second electrode 22. Through this streamer discharge, low temperature plasma is generated in the discharge field A. The low temperature plasma generates fast electrons, ions, ozone, radicals such as a hydroxy radical and other excited molecules (such as an excited oxygen molecule, an excited nitrogen molecule and an excited water molecule).

(Operation)

Next, the operation of the air purification equipment 1 will be described.

When the operation of the air purification equipment 1 is started and the centrifugal fan 12 is activated, the target air is sucked through the air inlet 15, and dust included in the air is collected by the dust filter 11. During the operation of the air purification equipment 1, the streamer discharge is caused between the first electrode 21 and the second electrode 22 of the plasma reactor 20, and hence, the air from which the dust has been removed by the dust filter 11 passes the discharge field A formed between these electrodes 21 and 22.

Figure 5:
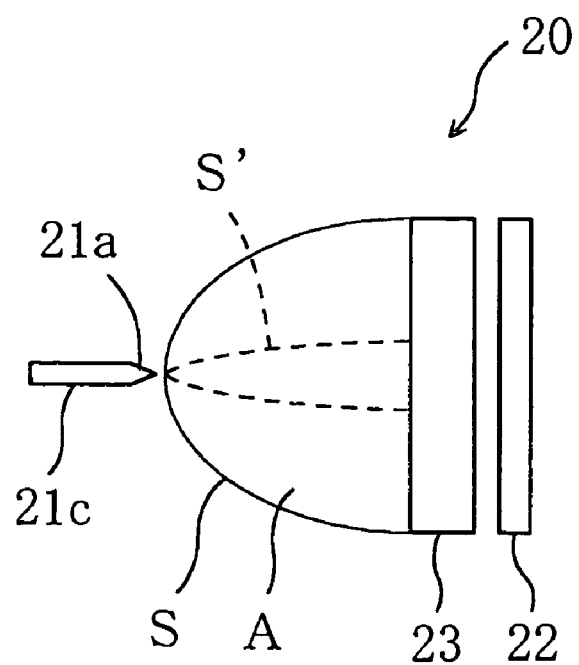
FIG. 5 is a diagram for showing the state of streamer discharge.

The streamer discharge is formed as a plasma column with light emission owing to small electric arcs caused continuously from the pointed portions of the first electrode 21 to the second electrode 22, and the small electric arcs progress in a row in a region with a small distance between the equipotential surfaces between the first electrode 21 and the second electrode 22. In this embodiment, the point angle θ of each needle electrode 21c of the first electrode 21 is 60 degrees, preferably not less than 30 degrees and not more than 90 degrees and more preferably not less than 60 degrees and not more than 90 degrees and the pointed portion is finely rounded as described above, and therefore, the small electric arc can easily progress while spreading in a wide range. Accordingly, in the plasma reactor 20 of this embodiment, the streamer discharge S is caused in a wider region than conventional streamer discharge as shown in FIG. 5 (in which the conventional streamer discharge S' is shown with a virtual line).

When the target air passes the discharge field A, the air is changed into plasma owing to the function of the streamer discharge, and thus, low temperature plasma is generated. A variety of active species produced through this discharge are further highly excited so as to attain higher activity through contact with the catalyst held on the treatment member 23, and hence are efficiently reacted with the toxic component or the odor component so that such a component can be decomposed to be removed. Accordingly, the toxic component and the odor component included in the target air can be rapidly decomposed through the synergistic effect of the plasma and the catalyst.

Furthermore, since the treatment member 23 also includes the adsorbent, the toxic component or the odor component included in the target air is adsorbed by the adsorbent, and the active species of the low temperature plasma definitely affect the adsorbed component, thereby accelerating the decomposition. Specifically, since both the catalyst and the adsorbent are included in one treatment member 23, the treatment can be more stably carried out.

Effect of Embodiment 1

In Embodiment 1, the point angle θ of the first electrode 21 is 60 degrees, preferably not less than 30 degrees and not more than 90 degrees and more preferably not less than 60 degrees and not more than 90 degrees, and the pointed portion is rounded, so that the small electric arc can easily progress while spreading in a wide range. Thus, the streamer discharge is caused in a wide region. Since the generation region of the streamer discharge is thus widened by specifying the shape of the pointed portion of the first electrode 21, there is no need to use a pulse source for supplying a steep pulse high voltage with a small pulse width. Therefore, a pulse source for supplying a pulse with gentle rise and fall, an AC power supply or even a DC power supply can be used. Accordingly, the cost can be suppressed, and the whole equipment can be prevented from having large scale and being complicated. Also, since there is no need to use a steep pulse, the discharge time can be long, and hence, the efficiency of the treatment of the target air can be improved.

Furthermore, while causing the discharge plasma in the shape of a flare in a wide region in the discharge field A formed between the first electrode 21 and the second electrode 22, the target air is allowed to pass through the openings 22a of the second electrode 22 on which the discharge plasma has the largest width. Therefore, the target air can be definitely treated. Furthermore, with the treatment member 23 disposed in the discharge field A, the target air is allowed to pass also through the treatment member 23 in passing the plasma space. Therefore, the plasma affects not only the target component included in the air and captured by the adsorbent but also the catalyst, so that the target air can be definitely treated through the synergistic effect of the plasma and the catalyst. In particular, the treatment member 23 is disposed in the vicinity of the counter electrode in which the plasma has the largest width in the discharge field A, and therefore, this effect can be more definitely attained. In this manner, the performance of the air purification equipment 1 can be sufficiently improved in this embodiment.

In addition, since the discharge is caused along the flow of the target air, the discharge can be stabilized.

EXAMPLES OF ALTERNATIVE CATALYST

Example 1

When a manganese-based catalyst is used as the catalyst, the catalyst may preferably include not less than 30 mass % and not more than 40 mass % of Mn, $MnO_2$ or $Mn_2O_3$. Alternatively, the content of Mn, $MnO_2$ or $Mn_2O_3$ in the catalyst may be not less than 10 mass % and not more than 60 mass %.

Figure 6:
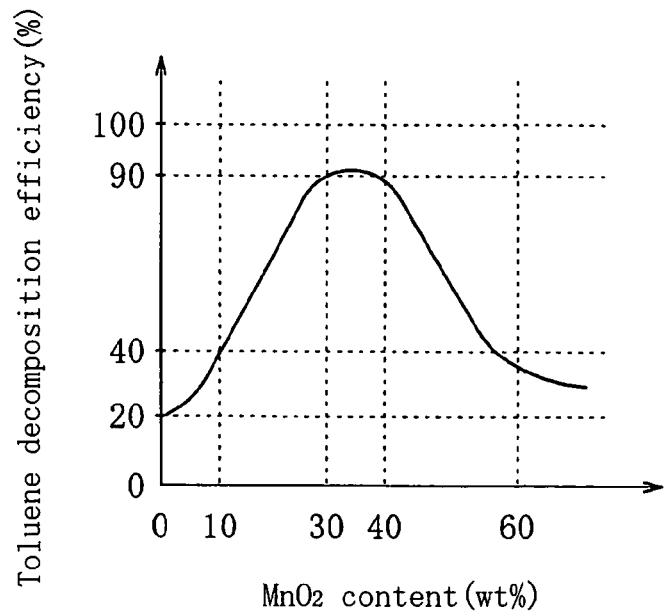
FIG. 6 is a graph for showing toluene decomposition efficiency of a manganese-based catalyst.

As shown in a graph of FIG. 6 in which the ordinate indicates toluene decomposition efficiency attained by using the plasma reactor 20 and the abscissa indicates the content of $MnO_2$, a catalyst including not less than 10 mass % and not more than 60 mass % of $MnO_2$ can attain comparatively high decomposition efficiency, and in particular, a catalyst including not less than 30 mass % and not more than 40 mass % of $MnO_2$ can attain very high decomposition efficiency.

Example 2

The treatment member 23 may include, as the catalyst, a mixture or a composite oxide of a manganese oxide and an oxide of at least one of iron, cerium, europium, lanthanum and copper (hereinafter referred to as the specified oxide). Also, in the treatment member 23, the composition ratio of the manganese oxide in the catalyst is not less than 20% and not more than 50%, and the composition ratio of the specified oxide is not less than 80% and not more than 50%. Furthermore, the catalyst may include several kinds of manganese oxides with different oxidation numbers, such as $MnO_2$ and $Mn_2O_3$.

When a catalyst including manganese, iron and cerium is used, the catalyst may be prepared as follows: An aqueous solution of manganese nitrate hexahydrate is prepared as a manganese compound, to which cerium nitrate hexahydrate is added as a cerium compound, and iron nitrate nonahydrate is added to the resultant as an iron compound, so as to give a solution A. On the other hand, a solution B in which an alkali compound is dissolved in water is prepared as a precipitation reagent. The solution A is poured into the solution B with stirring, so as to generate a coprecipitation. After aging for 1 hour, the coprecipitation is washed and dried, and the resultant is baked in the air at a temperature of 500° C. for 5 hours. Thus, the catalyst including manganese, iron and cerium can be obtained to be used in the honeycomb-shaped treatment member 23.

In using this catalyst, when the target air passing the discharge field A is activated by the function of the streamer discharge, the toxic component or the odor component similarly activated is efficiently reacted with the active species on the catalyst of the treatment member 23, so as to decompose and remove such a component. Therefore, the toxic component or the odor component included in the target air is rapidly decomposed through the synergistic effect of the plasma and the catalyst.

Specifically, the manganese oxide included in the catalyst decomposes ozone generated by the discharge into oxygen and active oxygen. This active oxygen oxidizes the toxic component or the odor component included in the target air so as to decompose it into an innocent component or an odorless component. Furthermore, the various active species, such as the active oxygen resulting from the decomposition of the ozone, radicals like a hydroxy radical, an excited oxygen molecule (active oxygen), an excited nitrogen molecule and an excited water molecule, are adsorbed in the form of the active species onto the surface of the specified oxide included in the treatment member 23 or onto the interface between the manganese oxide and the specified oxide. Therefore, there exist a large number of active species with high activity as active groups on the surface of the catalyst, so that the toxic component or the odor component included in the target air can be rapidly decomposed.

In this manner, when a catalyst including a mixture or a composite oxide of a manganese oxide and the specified oxide, that is, an oxide of at least one of iron, cerium, europium, lanthanum and copper, is used, a variety of active species produced by the low temperature plasma can be effectively used in the treatment for air purification, and hence, the chemical reaction occurring in treating the target air can be remarkably accelerated. As a result, the capacity of the plasma reactor 20 can be improved, and the performance of the air purification equipment 1 can be also improved.

Also, since the composition ratio of the manganese oxide in the catalyst is not less than 20% and not more than 50%, the manganese oxide and the other specified oxide are dispersed to be refined, and hence, the specific surface area of the catalyst is increased. Therefore, the interface between the manganese oxide and the specified oxide is increased, so that the catalyst can adsorb a larger number of active species. Furthermore, since the catalyst including the manganese oxide and the specified oxide is prepared by the coprecipitation process, the manganese oxide and the specified oxide are made refined to increase the specific surface area of the catalyst. Also owing to this, the interface between the manganese oxide and the specified oxide is so increased that a larger number of active species can be adsorbed, and hence, the activity can be further improved.

Moreover, since the catalyst is prepared by the coprecipitation process, not only $MnO_2$ but also another manganese oxide with a different oxidation number, such as $Mn_2O_3$, can be included in the catalyst. Therefore, a larger number of kinds of active species can be used in the treatment, and hence, the activity can be further improved. Furthermore, since the catalyst is prepared by the coprecipitation process, a large quantity of a composite oxide of the manganese oxide and the specified oxide is produced particularly on the interface between the manganese oxide and the specified oxide. Therefore, a composite oxide (such as $MnCeFe_2O_4$) having a different oxidation number from those of the manganese oxide (such as $MnO_2$ or $Mn_2O_3$) and the specified oxide (such as $Fe_2O_3$ or $CeO_2$) can be obtained, and thus, a larger number of kinds of active species can be used.

Also, when cerium is used as a substance other than manganese, an oxide of cerium, that is, $CeO_2$, has oxygen occlusion ability, and therefore, the quantity of oxygen to be used in the reaction occurring on the catalyst can be increased. Accordingly, as compared with the case where cerium is not used, the activity of the reaction can be improved. Furthermore, in using europium, lanthanum or copper, the activity can be further improved because a larger number of kinds of active species can be used, and thus, the reaction can be accelerated.

When such a catalyst is combined with the streamer discharge caused in a wide region, the performance of the air purification equipment can be further improved.

Embodiment 2

In Embodiment 1, the plasma reactor 20 in which the low temperature plasma generated by the streamer discharge is combined with the catalyst and the adsorbent is used in the air purification equipment 1 for purifying the target air by treating the toxic component or the odor component included in the target air through the oxidative destruction or the like. This plasma reactor 20 is applicable to nitrogen oxide purification equipment 2 for treating a nitrogen oxide included in a target gas through reduction decomposition or the like. In this case, an element suitably used for treating a nitrogen oxide is selected from those described in Embodiment 1 to be included in a catalyst.

Figure 7:
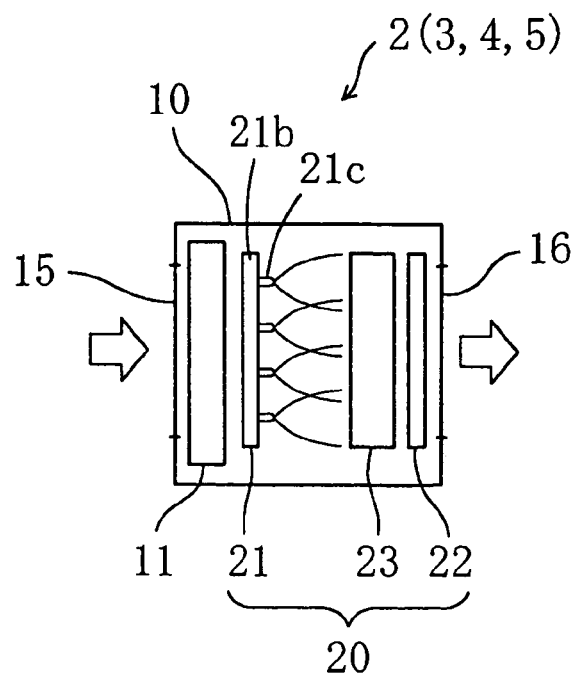
FIG. 7 is a schematic diagram for showing the architecture of nitrogen oxide purification equipment according to Embodiment 2 of the invention.

FIG. 7 schematically shows the cross-sectional architecture of the nitrogen oxide purification equipment 2. In this exemplified architecture, electrodes 21 and 22 have the same structure as that described in Embodiment 1 (shown in FIGS. 2 through 4), and specifically, the first electrode 21 is composed of an electrode plate 21b and needle electrodes 21c each having a point angle θ of 60 degrees (or not less than 30 degrees and not more than 90 degrees or preferably not less than 60 degrees and not more than 90 degrees). Also, the second electrode 22 includes an electrode plate, and the electrode plate 21b of the first electrode 21 and the second electrode 22 respectively have a large number of openings 21d and 22a.

In this nitrogen oxide purification equipment 2, a gas inlet 15 (corresponding to the air inlet of Embodiment 1) and a gas outlet 16 (corresponding to the air outlet of Embodiment 1) are provided to oppose each other on a pair of side faces of a casing 10, and a dust filter 11 is disposed along the gas inlet 15 in the casing 10. Also, in the plasma reactor 20, a honeycomb-shaped treatment member 23 holding a catalyst and an adsorbent is disposed between the first electrode 21 and the second electrode 22 in the same manner as described in Embodiment 1.

In this nitrogen oxide purification equipment 2, no fan is provided in the casing 10. Instead, the casing 10 of this equipment 2 is disposed with the facing direction of the gas inlet 15 and the gas outlet 16 corresponding to a passage of a target gas including a nitrogen oxide as a target component, so that the target gas can pass a discharge field A.

In this nitrogen oxide purification equipment 2, the target gas including a nitrogen oxide is introduced into the casing 10 through the gas inlet 15 and passes the discharge field A formed by the streamer discharge. Accordingly, the target gas is changed into plasma, and active species produced at this change are further excited in passing through the treatment member 23, so that the nitrogen oxide can be reduced to a nitrogen gas.

Also in Embodiment 2, the point angle θ of the first electrode 21 is specified so as to cause the streamer discharge in a wide region. Therefore, the low temperature plasma is generated in a wide region, so as to effectively affect the target gas and the catalyst and the adsorbent of the treatment member. Accordingly, the chemical reaction occurring in treating the target gas can be remarkably accelerated. As a result, the capacity of the plasma reactor 20 can be improved, and hence, the performance of the nitrogen oxide purification equipment 2 can be also improved. In addition, since there is no need to use a steep pulse voltage, the whole equipment can be downsized and the cost can be lowered.

Modifications of Embodiment 2

(Modification 1)

In Embodiment 2, the plasma reactor 20 using the low temperature plasma generated by the streamer discharge is applied to the nitrogen oxide purification equipment 2. This plasma reactor 20 is also applicable to flue gas purification equipment 3. The flue gas purification equipment 3 treats a nitrogen oxide included in a flue gas through reduction decomposition or the like and treats an unburnt fuel and hydrocarbon through oxidative destruction or the like. In this case, elements suitably used for reducing a nitrogen oxide and oxidizing an unburnt fuel and hydrocarbon are selected from those described in Embodiment 1 to be included in a catalyst.

The architecture of the flue gas purification equipment 3 is shown in FIG. 7, and namely, the flue gas purification equipment 3 and the nitrogen oxide purification equipment 2 have the same architecture but are used for different target substances. Therefore, the specific description of the architecture of the flue gas purification equipment 3 is herein omitted. Also in this equipment 3, the streamer discharge is caused in a wide region by specifying the shape (i.e., the point angle θ) of the pointed portion 21a of the first electrode 21 so as to generate the low temperature plasma in a wide region. Therefore, the whole equipment can be downsized and the cost can be lowered while attaining sufficient performance for treating the target gas.

(Modification 2)

The plasma reactor 20 of this invention is applicable to dioxin decomposition equipment 4 in addition to the air purification equipment 1, the nitrogen oxide purification equipment 2 and the flue gas purification equipment 3. The dioxin decomposition equipment 4 treats dioxin included in a flue gas through oxidative destruction or the like. In this case, a catalytic substance suitably used for the oxidative destruction of dioxin is selected from those described in Embodiment 1 to be included in a catalyst.

Also the dioxin decomposition equipment 4 may have the same architecture including the structure of electrodes 21 and 22 as that of the nitrogen oxide purification equipment 2. Also in this dioxin decomposition equipment 4, the streamer discharge is caused in a wide region by specifying the shape of the pointed portion 21a of the first electrode 21, so as to increase the generation region of the low temperature plasma. Therefore, while the whole equipment is downsized and the cost is lowered, active species produced by the low temperature plasma can be effectively used, so as to attain high performance for treating a target gas.

(Modification 3)

The plasma reactor 20 of this invention is further applicable to flon gas decomposition equipment 5 in addition to the air purification equipment 1, the nitrogen oxide purification equipment 2, the flue gas purification equipment 3 and the dioxin decomposition equipment 4. The flon gas decomposition equipment 5 decomposes a flon gas by allowing the flon gas to pass through the discharge field A of the electrodes 21 and 22 and the treatment member 23. In this case, a catalytic substance suitably used for decomposing a flon gas is selected from those described in Embodiment 1 to be included in a catalyst.

Also this flon gas decomposition equipment 5 may have the same architecture including the structure of the electrodes 21 and 22 as that of the nitrogen oxide purification equipment 2. Also in this flon gas decomposition equipment 5, the streamer discharge is caused in a wide region by specifying the shape of the pointed portion 21a of the first electrode 21, so as to increase the generation region of the low temperature plasma. Therefore, while the whole equipment is downsized and the cost is lowered, active species produced by the low temperature plasma are effectively used, so as to attain high performance for treating a target gas.

Example

An example of the plasma reactor will now be described on the basis of an experiment carried out for the performance of the plasma reactor 20 for treating a target fluid. First, in this example, a catalyst including manganese, iron and cerium (prepared by the coprecipitation process) is used to be held on the treatment member 23 having the honeycomb substrate 23a. The composition ratios of manganese, iron and cerium in this catalyst are 30%, 60% and 10%, respectively.

Figure 8:
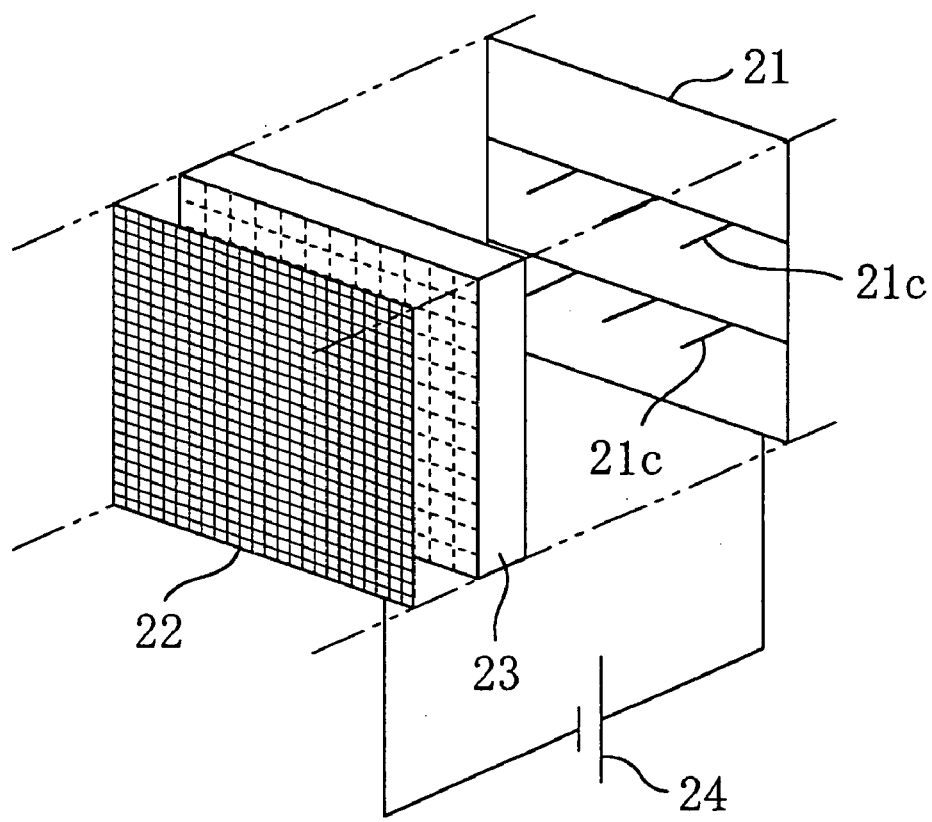
FIG. 8 is a diagram for roughly showing the architecture of an experiment apparatus used in an example.

In the experiment, an experiment apparatus having a reaction part as shown in FIG. 8 is used. In this apparatus, the first electrode 21 has a structure in which three brass needle electrodes 21c each having a diameter of 2 mm and a length of 8 mm and arranged in a lateral direction at an interval of 17.5 mm are provided in two lines having a gap of 20 mm therebetween. Furthermore, the second electrode 22 is made of a stainless steel mesh material with a dimension of 61 mm×80 mm. The first electrode 21 and the second electrode 22 are arranged at a distance of 22 mm with the respective needle electrodes 21c extending at right angle against the second electrode 22 of the stainless steel mesh material, and a DC high voltage (of 20 Kv) is applied.

Furthermore, the honeycomb-shaped treatment member 23 having a thickness of 10 mm and holding the aforementioned catalyst is disposed between the first electrode 21 and the second electrode 22 so as to be close to the second electrode 22 with a gap between the tip of each needle electrode 21c and the treatment member 23 set to 12 mm. As described in Embodiment 1, the pointed portion of the needle electrode 21c is sharpened to have a point angle of 60 degrees and is rounded to have a radius of 0.5 mm.

The streamer discharge caused in the aforementioned apparatus spreads in the shape of a flare from each needle electrode 21c of the first electrode 21 toward the second electrode 22 (as shown in FIGS. 2 and 5), and thus, the streamer discharge is caused in a very wide region as compared with a narrow column-shaped region of the conventional streamer discharge caused by using a DC or AC power supply. Then, a mixed gas of the air and 100 ppm of toluene is introduced into the apparatus at each of three kinds of space velocities (of 1000h−1, 2000h−1 and 5000h−1), and the attenuation of reactant and the increase of products under application of a DC high voltage of 20 Kv are respectively measured, so as to examine the oxidative destruction characteristic (treatment characteristic) against the odor substance.

Figure 9:
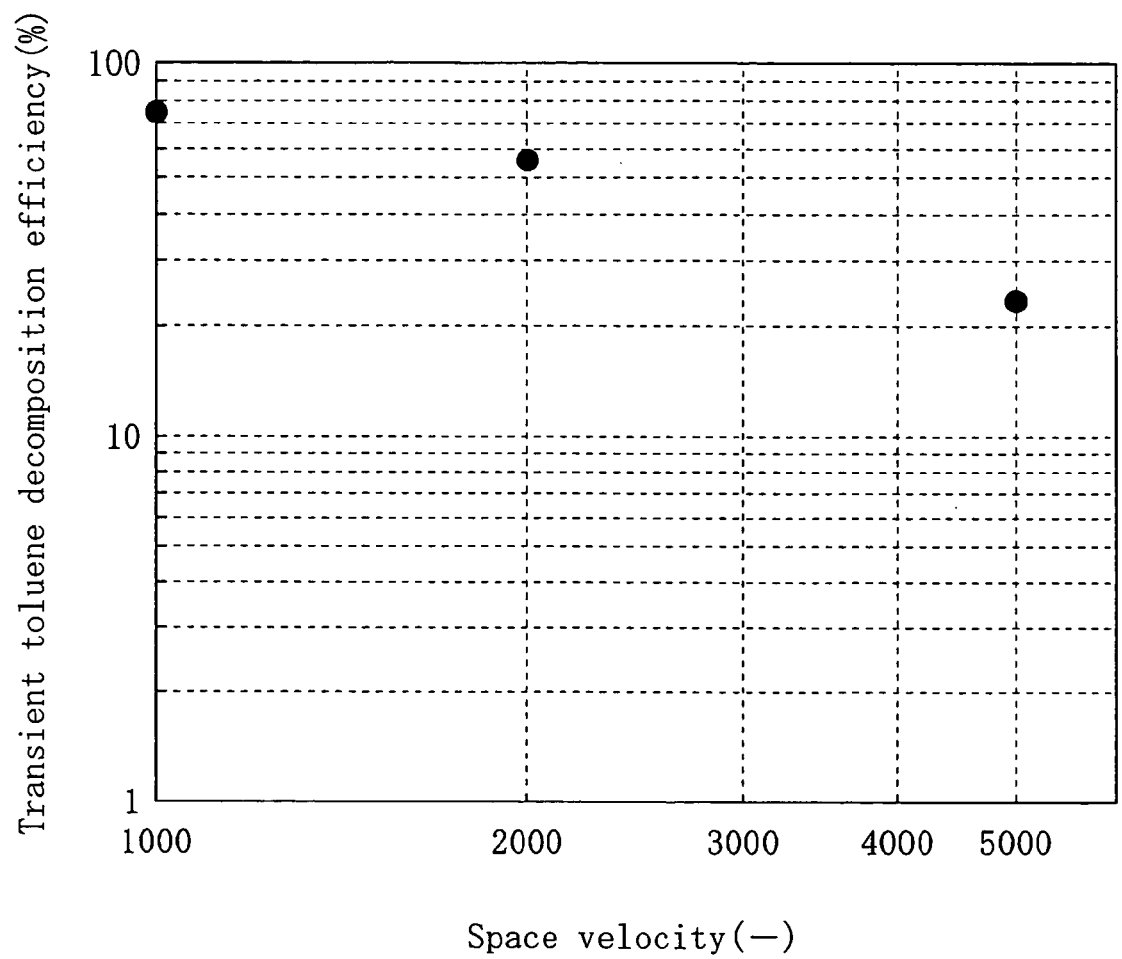
FIG. 9 is a graph for showing the result of an experiment performed in the example.

The result of the measurement is shown in a graph of FIG. 9. As shown in FIG. 9, very high decomposition efficiency can be attained in this example. In particular, when the space velocity is 1000h−1, the decomposition efficiency is very high. In this manner, although the DC voltage is used as a power supply and the needle electrodes 21c are arranged comparatively sparsely in this example, high decomposition efficiency can be attained. This reveals that the low temperature plasma can be generated in a wide region by specifying the point angle θ of the first electrode 21 and thus the function of the plasma can be improved.

A commercially available platinum-based catalyst, which includes platinum and aluminum in composition ratios of 0.5% and 99.5%, respectively and is conventionally used as a catalyst to be combined with low temperature plasma, is used instead of the aforementioned catalyst, and the attenuation characteristic of the reactant is examined under the aforementioned conditions. As a result, it is confirmed that the catalyst of the example can attain higher decomposition efficiency than the conventional catalyst and has very high activity.

Accordingly, when the catalyst of this example is used, the chemical reaction occurring in treating a target fluid in the plasma reactor 20 can be accelerated, so as to remarkably improve the treatment performance.

Embodiment 3

Figure 10:
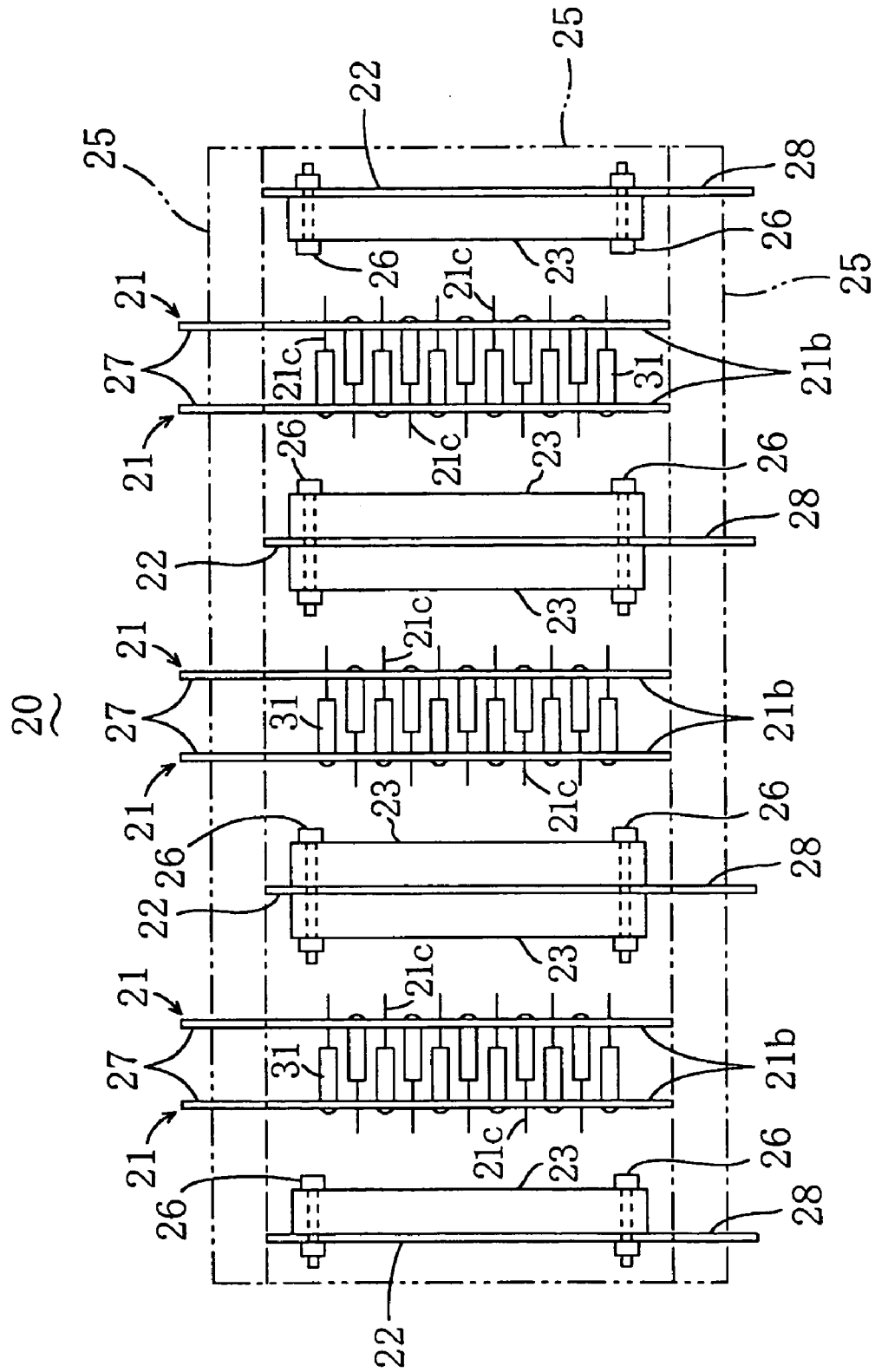
FIG. 10 is a diagram for showing the architecture of a plasma reactor according to Embodiment 3 of the invention.
Figure 11:
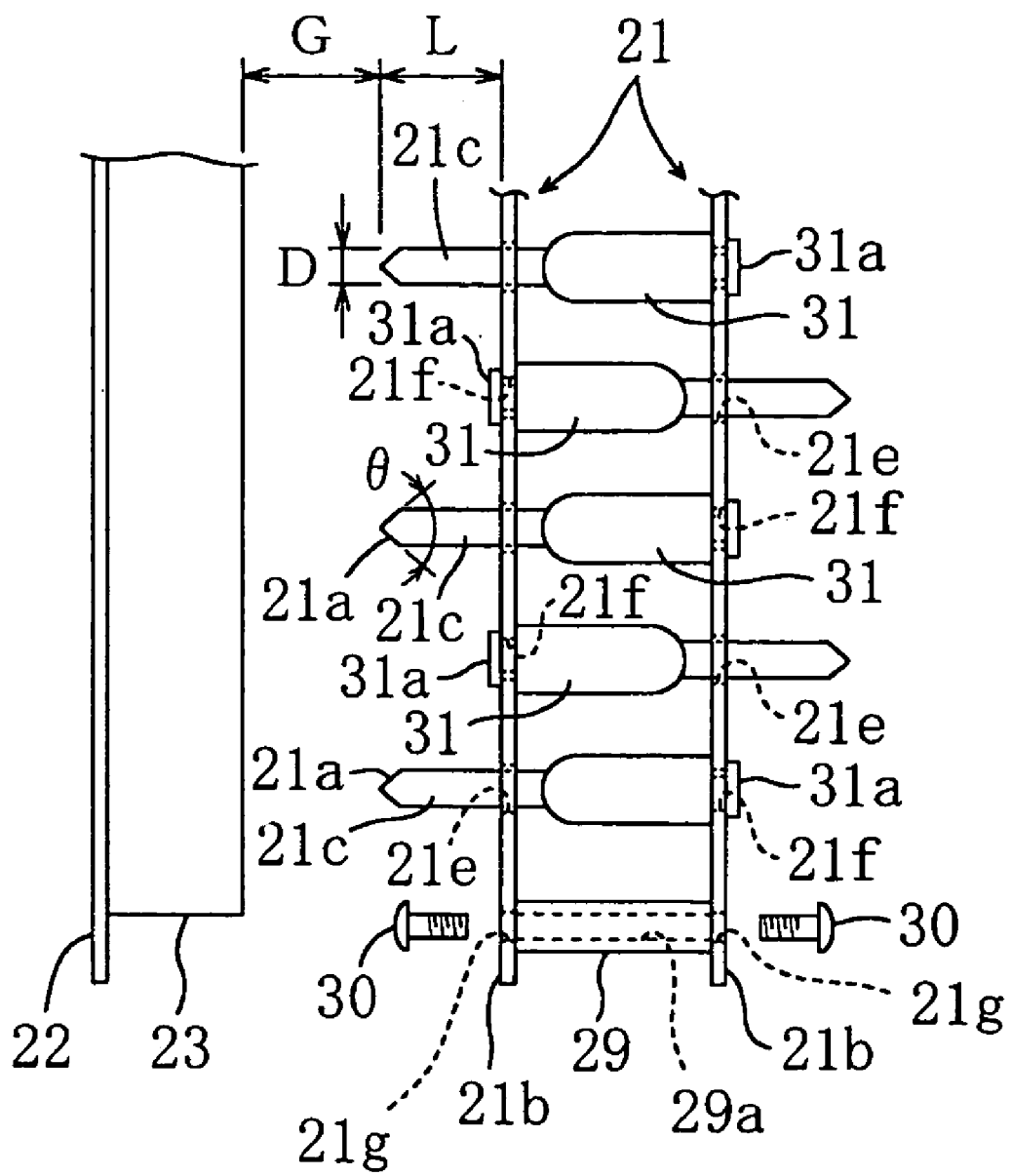
FIG. 11 is a diagram for showing the structure of an electrode part.

FIGS. 10 and 11 show the internal architecture of a plasma reactor 20 according to Embodiment 3. In this plasma reactor 20, three pairs of first electrodes 21 opposing and close to each other, namely, six first electrodes in total, are disposed in a space surrounded with four insulating walls 25 made of an insulating material such as glass, and needle electrodes 21c of one of the pair of first electrodes 21 are protruded through insertion holes 21e formed on a substrate 21b of the other first electrode 21.

Figure 12A:
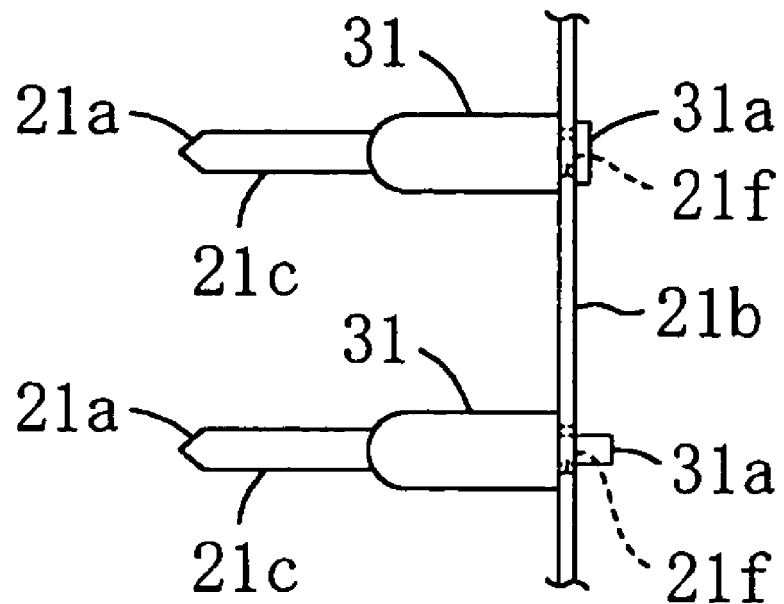
FIGS. 12A and 12B are explanatory diagrams for explaining how to fit a substrate with a needle electrode.
Figure 12B:
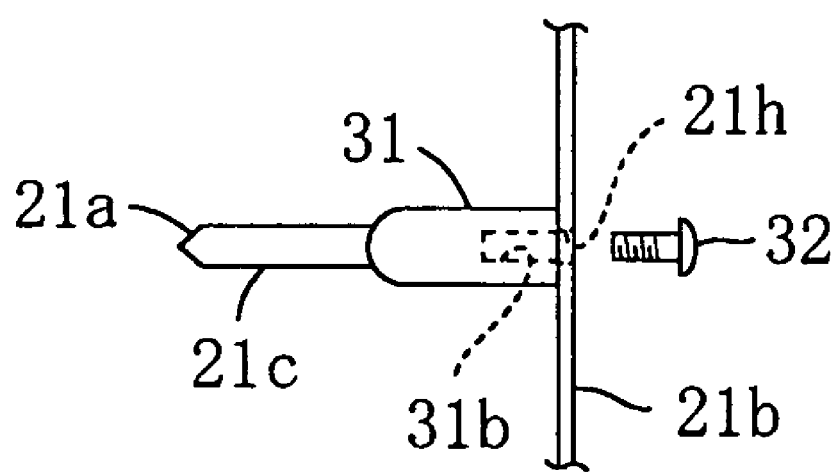

Specifically, in each first electrode pair, two first electrodes 21 each having needle electrodes fixed on a substrate 21b opposing each other with a spacer 29 sandwiched therebetween are fit in parallel to each other by screwing machine screws 30 in tapped holes 29a of the spacer 29 and holes 21g of the substrate 21b. Also, each needle electrode 21c is fixed on a base member 31, and the base member 31 is fixed on the substrate 21b by inserting a projection 31a provided at the bottom of the base member 31 into a hole 21f of the substrate 21b and caulking this portion (as shown in FIG. 12A). Alternatively, each needle electrode 21c may be fixed on the substrate 21b by forming a tapped hole 31b on the bottom of the base member 31 and screwing a machine screw 32 through a hole 21h of the substrate 21b in the tapped hole 31b (as shown in FIG. 12B).

Furthermore, in the plasma reactor 20, four second electrodes 22 are disposed so as to sandwich the first electrode pairs, and treatment members 23 are fixed with bolts 26 on both faces of two second electrodes 22 disposed in the middle and on inside faces of two second electrodes 22 disposed at the ends. In FIG. 10, a reference numeral 27 denotes a high-voltage terminal provided on the upper end of the first electrode 21, and a reference numeral 28 denotes a ground terminal provided on the lower end of the second electrode 22.

In Embodiment 3, the point angle θ of the pointed portion 21a opposing the second electrode of the first electrode 21 is not less than 30 degrees and not more than 90 degrees as in Embodiment 1. In addition, the needle-shaped effective length of the first electrode 21, namely, the effective length L of the needle electrode 21c, and the curvature radius R of the pointed portion of the first electrode 21 are set to fall in specified ranges, and the relationships of the effective length L and the curvature radius R with an electrode gap G or the diameter D of the needle electrode 21c are numerically specified. Thus, glow discharge and spark are avoided so as to stably cause the streamer discharge. Accordingly, when this plasma reactor 20 is used in air purification equipment, high purification performance can be exhibited for a long period of time.

Specifically, the effective length L of the needle electrode 21c of the first electrode 21 is set to be not less than 4 mm and not more than 30 mm.

The curvature radius R of the pointed portion of the first electrode 21 is set to be not less than 0.1 mm and not more than 0.7 mm.

A ratio L/G between the effective length L of the needle electrode 21c of the first electrode 21 and the electrodes gap G is set to be not less than 0.2 and not more than 1.5. Herein, the electrode gap G means a distance between the pointed portion of the needle electrode 21c of the first electrode 21 and the treatment member 23 (see FIG. 11).

A ratio L/D between the effective length L of the needle electrode 21c of the first electrode 21 and the diameter D of the needle electrode 21c is set to be not less than 2 and not more than 15.

A ratio R/G between the curvature radius R of the pointed portion of the first electrode 21 and the electrode gap G is set to be not less than 0.005 and not more than 0.035.

A ratio R/D between the curvature radius R of the pointed portion of the first electrode 21 and the diameter D of the needle electrode 21c is set to be not less than 0.05 and not more than 0.35.

The relationship among the effective length L of the needle electrode 21c of the first electrode 21, the electrode gap G and the point angle θ of the first electrode 21 is set to satisfy the following formula:

$$0.25 \leq L/G(\theta) \leq 1.2$$

In other words, a ratio L/Gθ is not less than 0.25 and not more than 1.2.

accuracy of the effective length L of the needle electrode 21c of the first electrode 21 can be secured. For example, the effective length L of the needle electrode 21c may be set to approximately 8.5 mm.

It is noted that the data listed in Tables 1 and 2 are obtained with the electrode gap G set to 20 mm and the diameter D of the needle electrode 21c to 2 mm. In Tables 1 and 2, data marked with "A" indicates that the streamer discharge is stably caused and the plasma generation region is wide. Data marked with "B" indicates that the streamer discharge is stably caused but the plasma generation region is narrower than that of the data "A". Data marked with "C" indicates that the streamer discharge is caused but is unstable as compared with that of the data "A" and "B". Data marked with "D" indicates that the streamer discharge is not generated.

TABLE 1

| | | Curvature radius R: 0.25 mm Point angle θ | | | | | | | Curvature radius R: 0.5 mm Point angle θ | | | | | | | Curvature radius R: 0.7 mm Point angle θ | | | | | | |
|---|---|---|---|---|---|---|---|---|---|---|---|---|---|---|---|---|---|---|---|---|---|
| | | 20° | 30° | 45° | 60° | 80° | 90° | 100° | 20° | 30° | 45° | 60° | 80° | 90° | 100° | 20° | 30° | 45° | 60° | 80° | 90° | 100° |
| Effective length L of needle electrode | 3.0 mm | D | D | D | C | C | C | D | D | D | D | D | C | C | D | D | D | D | D | C | C | D |
| | 8.5 mm | D | D | C | A | A | A | D | D | D | D | C | A | A | D | D | D | B | C | A | A | D |
| | 6.5 mm | D | C | A | A | C | C | D | D | D | D | C | C | C | D | D | D | C | C | C | C | D |
| | 4.5 mm | D | A | B | B | D | D | D | D | D | C | C | D | D | D | D | C | B | D | D | D | D |

TABLE 2

| | | Point angle θ: 30° Curvature radius R (mm) | | | | Point angle θ: 45° Curvature radius R (mm) | | | | Point angle θ: 60° Curvature radius R (mm) | | | | Point angle θ: 80° Curvature radius R (mm) | | | |
|---|---|---|---|---|---|---|---|---|---|---|---|---|---|---|---|---|---|
| | | 0.25 | 0.5 | 0.7 | 0.9 | 0.25 | 0.5 | 0.7 | 0.9 | 0.25 | 0.5 | 0.7 | 0.9 | 0.25 | 0.5 | 0.7 | 0.9 |
| Effective length L of needle electrode | 3.0 mm | D | D | D | D | D | D | D | D | C | D | D | D | C | C | C | D |
| | 8.5 mm | D | D | D | D | C | D | B | D | A | D | C | D | A | A | A | D |
| | 6.5 mm | C | D | D | D | A | D | C | D | A | C | C | D | C | C | C | D |
| | 4.5 mm | A | D | C | D | B | C | B | D | B | C | D | D | D | D | D | D |

The relationship between the effective length L of the needle electrode 21c of the first electrode 21 and the point angle θ of the first electrode 21 is set to satisfy the following formula:

$$5 \leq L/\theta \leq 24$$

In other words, a ratio L/θ is not less than 5 and not more than 24.

The aforementioned settings are on the basis of data listed in Tables 1 and 2 below, and the data reveals that the streamer discharge can be stabilized through the aforementioned numerical specification. In particular, in the case where the point angle θ of the first electrode 21 is 60 degrees, even if the fabrication accuracy of the effective length L of the needle electrode 21c of the first electrode 21 is poor, the streamer discharge can be stably caused as far as the fabrication accuracy of the curvature radius R of the pointed portion of the first electrode 21 can be secured. For example, the curvature radius R of the first electrode 21 may be set to approximately 0.25 mm. Also, in the case where the point angle θ of the first electrode 21 is 80 degrees, even if the fabrication accuracy of the curvature radius R of the pointed portion of the first electrode 21 is poor, the streamer discharge can be stably caused as far as the fabrication According to this embodiment, since the first electrodes 21 and the second electrodes 22 are alternately disposed, the number of times of a target fluid passing the discharge field is large, resulting in improving the treatment efficiency.

Also, since one second electrode 22 works as a counter electrode for two first electrodes 21, the architecture can be simplified.

Furthermore, since a plurality of first electrodes 21 and second electrodes 22 are used, the number of times of the target fluid passing the discharge field is large, resulting in improving the treatment efficiency.

In addition, since the needle electrodes 21c are dispersedly arranged, the target fluid definitely passes the discharge field, resulting in improving the treatment efficiency.

Alternative Embodiments

The present invention can be practiced in various other modifications that fall within the true spirit and scope of the invention.

For example, although the treatment member 23 including the catalytic substance and the adsorbent is disposed in the vicinity of the second electrode 22 in the discharge field A formed between the first electrode 21 and the second electrode 22 in Embodiment 1, the treatment member 23 may be disposed in the vicinity of the second electrode 22 downstream of the discharge field A as shown with a virtual line in FIG. 2. Alternatively, the treatment member 23 may be disposed in a position slightly away from the second electrode 22. As far as the position is within the range of the plasma, the treatment member 23 can exhibit its effect.

Alternatively, an air-permeable vessel filled with catalyst particles or adsorbent particles may be disposed in or downstream of the discharge field A instead of the honeycomb-shaped treatment member 23. Also in this manner, the aforementioned effects can be attained.

Furthermore, although the applications of the plasma reactor 20 to the air purification equipment 1, the nitrogen oxide purification equipment 2, the flue gas purification equipment 3 and the like are described in the aforementioned embodiments, the plasma reactor 20 is also applicable to any other equipment for treating a target fluid, such as an air-conditioner and a garbage disposer.

Moreover, although one treatment member 23 provides both the functions of the catalyst and the adsorbent in each of the aforementioned embodiments, a first treatment member for functioning as the catalyst and a second treatment member for functioning as the adsorbent may be individually disposed, or merely one of them may be disposed in or downstream of the discharge field.

While preferred embodiments of the invention have been described using specific terms, such description is for illustrative purposes only, and it is to be understood that changes and variations may be made without departing from the spirit or scope of the following claims.

What is claimed is:

1. A plasma reactor comprising:
a first electrode in the shape of a needle;
a second electrode in the shape of a plate disposed to oppose and to be substantially perpendicular to said first electrode; and
a power supply means connected to said first and second electrodes for applying a discharge voltage,
said first electrode and said second electrode being disposed in a passage space of a target fluid for treating said target fluid by causing streamer discharge between said first and second electrodes, and
said first electrode having a pointed portion as an end thereof on the side of said second electrode and said pointed portion having a point angle $\theta$ not less than 30 degrees and not more than 90 degrees and a ratio L/G between a needle-shaped effective length L of said first electrode and an electrode gap G is not less than 0.2 and not more than 1.5.

2. The plasma reactor of claim 1,
wherein said point angle $\theta$ of said first electrode is not less than 60 degrees and not more than 90 degrees.

3. The plasma reactor of claim 2,
wherein said point angle $\theta$ of said first electrode is substantially 60 degrees.

4. The plasma reactor of claim 2,
wherein said point angle $\theta$ of said first electrode is substantially 80 degrees.

5. The plasma reactor of claim 1,
wherein said pointed portion of said first electrode is in a spherical shape.

6. The plasma reactor of claim 1,
wherein said needle-shaped effective length L is not less than 4 mm and not more than 30 mm.

7. The plasma reactor of claim 1,
wherein said pointed portion of said first electrode has a curvature radius R not less than 0.1 mm and not more than 0.7 mm.

8. The plasma reactor of claim 1,
wherein a ratio L/D between said needle-shaped effective length L and a diameter D of said first electrode is not less than 2 and not more than 15.

9. The plasma reactor of claim 1,
wherein a ratio R/G between a curvature radius R of said pointed portion of said first electrode and said electrode gap G is not less than 0.005 and not more than 0.035.

10. The plasma reactor of claim 1,
wherein a ratio R/D between a curvature radius R of said pointed portion of said first electrode and a diameter D of said first electrode is not less than 0.05 and not more than 0.35.

11. The plasma reactor of claim 1,
wherein said needle-shaped effective length L of said first electrode, said electrode gap G and said point angle $\theta$ of said first electrode satisfy the following formula:

$$0.25 \leq L/(G\theta) \leq 1.2.$$

12. The plasma reactor of claim 1,
wherein said needle-shaped effective length L and said point angle $\theta$ of said first electrode satisfy the following formula:

$$5 \leq L/\theta \leq 24.$$

13. The plasma reactor of claim 1,
wherein said second electrode has an opening through which said target fluid passes.

14. The plasma reactor of claim 1, further comprising a treatment member for treating said target fluid,
wherein said treatment member is disposed between or downstream of said first electrode and said second electrode.

15. The plasma reactor of claim 14,
wherein said treatment member is disposed between said first electrode and said second electrode and in the vicinity of said second electrode.

16. The plasma reactor of claim 14,
wherein said treatment member has a catalytic substance for accelerating the treatment of said target fluid.

17. The plasma reactor of claim 16,
wherein said catalytic substance includes at least one element selected from the group consisting of Pt, Pd, Ni, Ir, Rh, Co, Os, Ru, Fe, Re, Tc, Mn, Au, Ag, Cu, W, Mo and Cr.

18. The plasma reactor of claim 16,
wherein said catalytic substance includes not less than 10 mass % and not more than 60 mass % of a manganese-based catalyst.

19. The plasma reactor of claim 18,
wherein said catalytic substance includes not less than 30 mass % and not more than 40 mass % of said manganese-based catalyst.

20. The plasma reactor of claim 16,
wherein said treatment member includes, as said catalytic substance, a mixture of a manganese oxide and an oxide of at least one of iron, cerium, europium, lanthanum and copper, or a composite oxide of manganese and at least one of one of iron, cerium, europium, lanthanum and copper.

21. The plasma reactor of claim 20,
wherein said manganese oxide has a composition ratio not less than 20% and not more than 50% in said catalytic substance.

22. The plasma reactor of claim 20,
wherein said treatment member includes, as said catalytic substance, a plurality of kinds of manganese oxides respectively having different oxidation numbers.

23. The plasma reactor of claim 14,
wherein said treatment member includes an adsorbent for adsorbing a target component included in said target fluid.

24. The plasma reactor of claim 23,
wherein said adsorbent is at least one of porous ceramic, activated carbon, activated carbon fiber, zeolite, mordenite, ferrierite and silicalite.

25. The plasma reactor of claim 1,
wherein said first electrode is disposed on an upstream side of a flow of said target fluid, and
said second electrode is disposed on a downstream side of the flow of said target fluid.

26. The plasma reactor of claim 1,
wherein said first electrode and said second electrode are alternately disposed along a flow of said target fluid.

27. The plasma reactor of claim 1,
one first electrode is disposed on one side of said second electrode and another first electrode is disposed on the other side of said second electrode.

28. The plasma reactor of claim 1,
wherein said power supply means is a pulse source for supplying a pulse with gentle rise and fall.

29. The plasma reactor of claim 1,
wherein said power supply means is an AC power supply.

30. The plasma reactor of claim 1,
wherein said power supply means is a DC power supply.

31. The plasma reactor of claim 1,
wherein said first electrode and said second electrode are plural in number and are disposed along a flow of said target fluid.

32. The plasma reactor of claim 1,
wherein said first electrode has needle electrodes, and
said needle electrodes are dispersedly arranged on a cross-sectional plane of the passage space.

33. Purification equipment comprising:
a casing; and
a plasma reactor contained in a passage space of target air in said casing and including a first electrode in the shape of a needle, a second electrode in the shape of a plate disposed to oppose and to be substantially perpendicular to said first electrode, and power supply means connected to said first and second electrodes for applying a discharge voltage,
wherein said first electrode has a pointed portion as an end thereof on the side of said second electrode and said pointed portion has a point angle $\theta$ not less than 30 degrees and not more than 90 degrees and a ratio L/G between a needle-shaped effective L of said first electrode and an electrode gap G is not less than 0.2 and not more than 1.5, and
an odor component or a toxic component included in said target air is treated by allowing said target air to pass a discharge field of streamer discharge caused between said first and second electrodes.

34. Purification equipment comprising:
a casing; and
a plasma reactor contained in a passage space of a target gas in said casing and including a first electrode in the shape of a needle, a second electrode in the shape of a plate disposed to oppose and to be substantially perpendicular to said first electrode, and power supply means connected to said first and second electrodes for applying a discharge voltage,
wherein said first electrode has a pointed portion as an end thereof on the side of said second electrode and said pointed portion has a point angle $\theta$ not less than 30 degrees and not more than 90 degrees and a ratio L/G between a needle-shaped effective L of said first electrode and an electrode gap G is not less than 0.2 and not more than 1.5, and
a nitrogen oxide included in said target gas is treated by allowing said target gas to pass a discharge field of streamer discharge caused between said first and second electrodes.

35. Purification equipment comprising:
a casing; and
a plasma reactor contained in a passage space of a flue gas in said casing and including a first electrode in the shape of a needle, a second electrode in the shape of a plate disposed to oppose and to be substantially perpendicular to said first electrode, and power supply means connected to said first and second electrodes for applying a discharge voltage,
wherein said first electrode has a pointed portion as an end thereof on the side of said second electrode and said pointed portion has a point angle $\theta$ not less than 30 degrees and not more than 90 degrees and a ratio L/G between a needle-shaped effective L of said first electrode and an electrode gap G is not less than 0.2 and not more than 1.5, and
a nitrogen oxide, unburnt fuel and hydrocarbon included in said flue gas are treated by allowing said flue gas to pass a discharge field of streamer discharge caused between said first and second electrodes.

36. Purification equipment comprising:
a casing; and
a plasma reactor contained in a passage space of a flue gas in said casing and including a first electrode in the shape of a needle, a second electrode in the shape of a plate disposed to oppose and to be substantially perpendicular to said first electrode, and power supply means connected to said first and second electrodes for applying a discharge voltage,
wherein said first electrode has a pointed portion as an end thereof on the side of said second electrode and said pointed portion has a point angle $\theta$ not less than 30 degrees and not more than 90 degrees and a ratio L/G between a needle-shaped effective L of said first electrode and an electrode gap G is not less than 0.2 and not more than 1.5, and
dioxin included in said flue gas is treated by allowing said flue gas to pass a discharge field of streamer discharge caused between said first and second electrodes.

37. Purification equipment comprising:
a casing; and
a plasma reactor contained in a passage space of a flon gas in said casing and including a first electrode in the shape of a needle, a second electrode in the shape of a plate disposed to oppose and to be substantially perpendicular to said first electrode, and power supply means connected to said first and second electrodes for applying a discharge voltage, wherein said first electrode has a pointed portion as an end thereof on the side of said second electrode and said pointed portion has a point angle θ not less than 30 degrees and not more than 90 degrees and a ratio L/G between a needle-shaped effective L of said first electrode and an electrode gap G is not less than 0.2 and not more than 1.5, and said flon gas is treated by allowing said flon gas to pass a discharge field of streamer discharge caused between said first and second electrodes.

* * * * *